United States Patent
Kato et al.

(10) Patent No.: US 6,449,185 B2
(45) Date of Patent: Sep. 10, 2002

(54) SEMICONDUCTOR MEMORY AND METHOD FOR DRIVING THE SAME

(75) Inventors: Yoshihisa Kato, Shiga (JP); Yasuhiro Shimada, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/886,995

(22) Filed: Jun. 25, 2001

(30) Foreign Application Priority Data

Jun. 27, 2000 (JP) ........................................ 2000-192467

(51) Int. Cl.[7] .............................................. G11C 11/22
(52) U.S. Cl. ................................... 365/145; 365/189.09
(58) Field of Search ............................ 365/145, 189.09, 365/117, 149

(56) References Cited

U.S. PATENT DOCUMENTS

| | | | |
|---|---|---|---|
| 5,361,224 A | | 11/1994 | Takasu |
| 5,615,144 A | * | 3/1997 | Kimura ........................ 365/145 |
| 5,959,879 A | * | 9/1999 | Koo ............................. 365/145 |
| 6,097,058 A | * | 8/2000 | Nakamura .................... 257/316 |

FOREIGN PATENT DOCUMENTS

JP          05-250881           9/1993

* cited by examiner

*Primary Examiner*—A. Zarabian
(74) *Attorney, Agent, or Firm*—Nixon Peabody LLP; Donald R. Studebaker

(57) ABSTRACT

A semiconductor memory includes a storing transistor for storing data, wherein the storing transistor includes an MFS transistor, an MFIS transistor, or an MFMIS transistor, and a selecting transistor for selecting the storing transistor. The storing transistor is a first field effect transistor having a first well region. The selecting transistor is second field effect transistor having a second well region that is isolated from the first well region of the first field effect transistor. The semiconductor memory further includes a first voltage supply line for supplying a DC voltage to the first well region of the first field effect transistor, and a second voltage supply line, independent of the first voltage supply line, for supplying a DC voltage to the second well region of the second field effect transistor.

11 Claims, 14 Drawing Sheets

FIG. 2

|  | OPERATION | | SIGNAL |
|---|---|---|---|
|  | WRITE | READ | |
| WL1 | $V_p$ | $V_p$ | AC |
| SL1 | 0 | 0 | AC |
| GL1 | $\pm V_p$ | $V_r$ | AC |
| BL1 | 0 | $V_d$ | AC |
| V1 | $-V_p$ | $-V_p$ | DC |
| W1 | 0 | 0 | DC |
| WL2 | $-V_p$ | $-V_p$ | AC |
| SL2 | 0 | 0 | AC |
| GL2 | 0 | 0 | AC |
| BL2 | 0 | 0 | AC |
| V2 | $-V_p$ | $-V_p$ | DC |
| W2 | 0 | 0 | DC |

FIG. 12

|  | OPERATION | | SIGNAL |
|---|---|---|---|
|  | WRITE | READ | |
| WL1 | $-V_p$ | $-V_p$ | AC |
| SL1 | 0 | 0 | AC |
| GL1 | $\pm V_p$ | $V_r$ | AC |
| BL1 | 0 | $V_d$ | AC |
| V1 | $V_p$ | $V_p$ | DC |
| W1 | 0 | 0 | DC |
| WL2 | 0 | 0 | AC |
| SL2 | 0 | 0 | AC |
| GL2 | 0 | 0 | AC |
| BL2 | 0 | 0 | AC |
| V2 | $V_p$ | $V_p$ | DC |
| W2 | 0 | 0 | DC |

| | OPERATION | | | SIGNAL |
|---|---|---|---|---|
| | ERASE | WRITE | READ | |
| WL | $V_G$ | $V_G$ | 0 | AC |
| RL | 0 | 0 | $V_G$ | AC |
| GL | 0 | $V_P$ | 0 | AC |
| BL | 0 | 0 | $V_d$ | AC |
| SUBSTRATE | $-V_{GE}$ | 0 | 0 | DC |

SEMICONDUCTOR MEMORY AND
METHOD FOR DRIVING THE SAME

BACKGROUND OF THE INVENTION

The present invention relates to a nonvolatile semiconductor memory and a method for driving the same. More particularly, it relates to a semiconductor memory including a storing transistor for storing a data composed of an MFS transistor including a field effect transistor having a gate electrode formed on a ferroelectric film, an MFIS transistor including a field effect transistor having a gate electrode formed on a multi-layer film of a ferroelectric film and a dielectric film or an MFMIS transistor including a ferroelectric capacitor formed above a gate electrode of a field effect transistor, and a method for driving the same.

Known one-transistor type nonvolatile semiconductor memories having a ferroelectric film are three types of transistors, that is, an MFS transistor, an MFIS transistor and an MFMIS transistor.

An MFS transistor has a Metal/Ferroelectric/Semiconductor multi-layer structure and includes a gate insulating film of a ferroelectric film directly formed on a channel region of a semiconductor substrate.

An MFIS transistor has a Metal/Ferroelectric/Insulator/Semiconductor multi-layer structure and includes a dielectric film serving as a buffer layer formed between a gate insulating film of a ferroelectric film and a semiconductor substrate. The MFIS transistor is improved in the surface characteristic as compared with the MFS transistor.

An MFMIS transistor has a Metal/Ferroelectric/Metal/Insulator/Semiconductor multi-layer structure and includes a ferroelectric capacitor formed above a gate electrode of a field effect transistor having the MOS structure. The MFMIS transistor is formed in either of the following two known structures: In the first structure, the ferroelectric capacitor is formed above the gate electrode of the field effect transistor with an insulating film sandwiched therebetween; and in the second structure, the gate electrode of the field effect transistor also works as the lower electrode of the ferroelectric capacitor.

In a memory cell using, as a data storing transistor, a one-transistor type nonvolatile semiconductor memory having a ferroelectric film (namely, a nonvolatile memory), the memory cell is constructed by connecting a transistor for gate selection and a transistor for source selection to a data storing transistor of an MFS transistor as disclosed in, for example, Japanese Patent No. 2921812.

FIG. 14 shows the circuit configuration of the one-transistor type nonvolatile semiconductor memory described in Japanese Patent No. 2921812. In FIG. 14, WL denotes a word line for write, RL denotes a word line for read, GL denotes an operation voltage supply line, BL denotes a bit line, $Q_1$ denotes a data storing transistor, $Q_2$ denotes a writing transistor and $Q_3$ denotes a reading transistor.

The gate of the data storing transistor $Q_1$ is connected to the operation voltage supply line GL through the writing transistor $Q_2$, the drain of the data storing transistor $Q_1$ is connected to the bit line BL through the reading transistor $Q_3$, and the source of the data storing transistor $Q_1$ is grounded. A memory cell array is formed by arranging a plurality of memory cells each having this circuit configuration on a silicon substrate.

A data erase operation, a data write operation and a data read operation of the memory cell having this circuit configuration will now be described with reference to FIG. 15.

In the data erase operation, negative potential is applied to a well region of a semiconductor substrate so as to apply a voltage between the gate of each data storing transistor $Q_1$ and the substrate. Thus, the polarization of the ferroelectric film is turned along the same direction. In this manner, data stored in all the memory cells are erased.

In the data write operation, a voltage is applied between the substrate and the gate of the data storing transistor $Q_1$ of the memory cell disposed at an address selected by the writing transistor $Q_2$, so as to reverse the polarization direction of the ferroelectric film of this transistor (to place it in an on-state) or the polarization direction of the ferroelectric film of the transistor is kept (to place it in an off-state) without applying the voltage between the gate and the substrate. Specifically, a data is written by causing either of two kinds of polarized states, that is, to reverse the polarization (which corresponds to an on-state) and to keep the polarization (which corresponds to an off-state) in accordance with the input data. Since the polarized state of the ferroelectric film is kept without applying a voltage, the memory cell functions as a nonvolatile semiconductor memory.

In the data read operation, the reading transistor $Q_3$ is turned on, so as to detect voltage drop accompanied by a current flowing from the bit line BL through the channel of the data storing transistor $Q_1$ to a ground line (namely, a drain-source current). Since the channel resistance is varied depending upon the polarized state of the ferroelectric film of the data storing transistor $Q_1$, a data written in the data storing transistor $Q_1$ can be thus read.

Japanese Laid-Open Patent Publication No. 5-205487 describes a nonvolatile semiconductor memory in which a well region of a data storing transistor of each memory cell is isolated. The circuit configuration of this semiconductor memory is basically the same as that of the aforementioned semiconductor memory, and a well region of a first field effect transistor working as a data storing transistor is, shared by a selecting transistor for selecting the storing transistor.

The aforementioned conventional semiconductor memory has the following problem: A data is written in each storing transistor after erasing all data stored in the storing transistors sharing the well region in a batch by turning the polarization of the ferroelectric films along one direction by applying a voltage to the well region of the field effect transistors working as the storing transistors, and therefore, it takes a long time to rewrite (overwrite) data.

Furthermore, since data stored in a plurality of storing transistors are erased by applying a voltage to the well region shared by the plural storing transistors and having large load capacitance, the speed of a data erase operation is disadvantageously low.

SUMMARY OF THE INVENTION

In consideration of the aforementioned conventional problems, an object of the invention is reducing time required for data rewrite (overwrite) by rewriting a data without erasing data having been written in storing transistors.

In order to achieve the object, the semiconductor memory of this invention comprises a storing transistor for storing a data composed of any of an MFS transistor including a first field effect transistor having a gate electrode formed on a ferroelectric film, an MFIS transistor including a first field effect transistor having a gate electrode formed on a multi-layer film of a ferroelectric film and a dielectric film and an MFMIS transistor including a ferroelectric capacitor formed above a gate electrode of a first field effect transistor, the first field effect transistor having a first well region; a selecting transistor for selecting the storing transistor composed of a second field effect transistor, the second field effect transistor having a second well region that is isolated from the first well region of the first field effect transistor; a first voltage supply line for supplying a DC voltage to the first well region of the first field effect transistor; and a second voltage supply line independent of the first voltage supply line for supplying a DC voltage to the second well region of the second field effect transistor.

In the semiconductor memory of this invention, the first well region of the first field effect transistor included in the storing transistor is isolated from the second well region of the second field effect transistor included in the selecting transistor, and the first voltage supply line for supplying the DC voltage to the first well region of the first field effect transistor and the second voltage supply line for supplying the DC voltage to the second well region of the second field effect transistor are independently provided. Therefore, while applying a first DC voltage to the first well region of the first field effect transistor of the storing transistor independently of the second well region of the second field effect transistor of the selecting transistor, a second DC voltage with polarity positive or negative with respect to the first DC voltage applied to the first well region can be applied to the control gate of the first field effect transistor of the storing transistor, so as to write a data in the semiconductor memory. Accordingly, without conducting an operation for erasing data stored in storing transistors, a data can be written in a desired storing transistor. In other words, a data can be written without conducting the operation for erasing data of storing transistors by applying a voltage to a well region shared by the plural transistors and having large load capacitance. As a result, time required for data rewrite can be reduced.

In the semiconductor memory, the second field effect transistor preferably has higher breakdown voltage than the first field effect transistor.

In this case, although the operation speed of the second field effect transistor to which a large voltage is applied is relatively lowered, the breakdown voltage thereof can be increased, and the operation speed of the first field effect transistor to which a large voltage is not applied can be increased.

In the semiconductor memory, it is preferred that the storing transistor is composed of the MFMIS transistor and that the second field effect transistor includes a gate insulating film having a larger thickness than a gate insulating film of the first field effect transistor.

Thus, the second field effect transistor can definitely attain higher breakdown voltage than the first field effect transistor.

In the semiconductor memory, it is preferred that the storing transistor is composed of the MFMIS transistor, that the first field effect transistor and the second field effect transistor have an LDD structure and that the second field effect transistor includes a lightly-doped layer having a larger length than a lightly-doped layer of the first field effect transistor.

Thus, the second field effect transistor can definitely attain higher breakdown voltage than the first field effect transistor.

In the semiconductor memory, it is preferred that the storing transistor is composed of the MFMIS transistor and that the second field effect transistor includes a gate electrode having a larger gate length than a gate electrode of the first field effect transistor.

Thus, the second field effect transistor can definitely attain higher breakdown voltage than the first field effect transistor.

In the semiconductor memory, it is preferred that the first field effect transistor, the second field effect transistor and a driving circuit for driving the first and second field effect transistors are formed on one semiconductor substrate and that a driving voltage supplied to the driving circuit and the DC voltage supplied to the second well region of the second field effect transistor are supplied from one voltage supply.

In this case, there is no need to generate the DC voltage to be supplied to the second well region of the second field effect transistor, and therefore, a DC voltage generation circuit formed on the semiconductor substrate can be simplified and reduced in its area.

In the semiconductor memory, the first well region of the first field effect transistor and the second well region of the second field effect transistor preferably have different conductivity types.

In this manner, the driving voltage supplied to the driving circuit and the DC voltage supplied to the second well region of the second field effect transistor can be easily supplied from the same voltage supply. Accordingly, the DC voltage generation circuit formed on the semiconductor substrate can be definitely simplified.

The method of this invention for driving a semiconductor memory including a storing transistor for storing a data composed of any of an MFS transistor including a first field effect transistor having a gate electrode formed on a ferroelectric film, an MFIS transistor including a first field effect transistor having a gate electrode formed on a multi-layer film of a ferroelectric film and a dielectric film and an MFMIS transistor including a ferroelectric capacitor formed above a gate electrode of a first field effect transistor, and a selecting transistor for selecting the storing transistor composed of a second field effect transistor, the first field effect transistor having a first well region that is isolated from a second well region of the second field effect transistor, comprises a step of writing a data in the storing transistor by applying a first DC voltage to the first well region of the first field effect transistor and applying a second DC voltage with polarity positive or negative with respect to the first DC voltage to a control gate of the first field effect transistor.

In the method for driving a semiconductor memory of this invention, while applying the first DC voltage to the first well region of the first field effect transistor included in the storing transistor, the second DC voltage with polarity positive or negative with respect to the first DC voltage is applied to the control gate of the first field effect transistor, so as to write a data in the semiconductor memory. Therefore, without conducting an operation for erasing data written in storing transistors, a data can be written in a desired storing transistor. Accordingly, a data can be written without conducting the operation for erasing data of the storing transistors by applying a voltage to a well region shared by the plural storing transistors and having large load capacitance. As a result, the time required for data rewrite can be reduced.

In the method for driving a semiconductor memory, the second field effect transistor preferably has higher breakdown voltage than the first field effect transistor.

In this case, although the operation speed of the second field effect transistor to which a large voltage is applied is relatively lowered, the breakdown voltage thereof can be increased, and the operation speed of the first field effect transistor to which a large voltage is not applied can be increased.

In the method for driving a semiconductor memory, a driving voltage supplied to a driving circuit for driving the first and second field effect transistors and a DC voltage supplied to the second well region of the second field effect transistor are preferably supplied from one voltage supply.

In this case, since there is no need to generate a DC voltage to be supplied to the second well region of the second field effect transistor, a DC voltage generation circuit formed on the semiconductor substrate can be simplified and reduced in its area.

In the method for driving a semiconductor memory, the first well region of the first field effect transistor and the second well region of the second field effect transistor preferably have different conductivity types.

Thus, the driving voltage supplied to the driving circuit and the DC voltage supplied to the second well region of the second field effect transistor can be easily supplied from the same voltage supply. Therefore, the DC voltage generation circuit formed on the semiconductor substrate can be definitely simplified.

BRIEF DESCRIPTION OF THE DRAWINGS

FIG. 2 is a diagram of voltages applied in a write operation and a read operation of a memory cell included in the memory cell array in which the memory cells each including the semiconductor memory of Embodiment 1 are arranged in the form of a matrix;

FIG. 12 is a diagram of voltages applied in a write operation and a read operation of a memory cell included in the memory cell array in which the memory cells each including the semiconductor memory of Embodiment 2 are arranged in the form of a matrix;

DETAILED DESCRIPTION OF THE INVENTION

Embodiment 1

A semiconductor memory and a method for driving the same according to Embodiment 1 of the invention will now be described with reference to FIGS. 1 through 4. Although the semiconductor memory of Embodiment 1 uses an MFMIS transistor as a storing transistor for storing a data, an MFS transistor or an MFIS transistor may be used instead.

Figure 1:
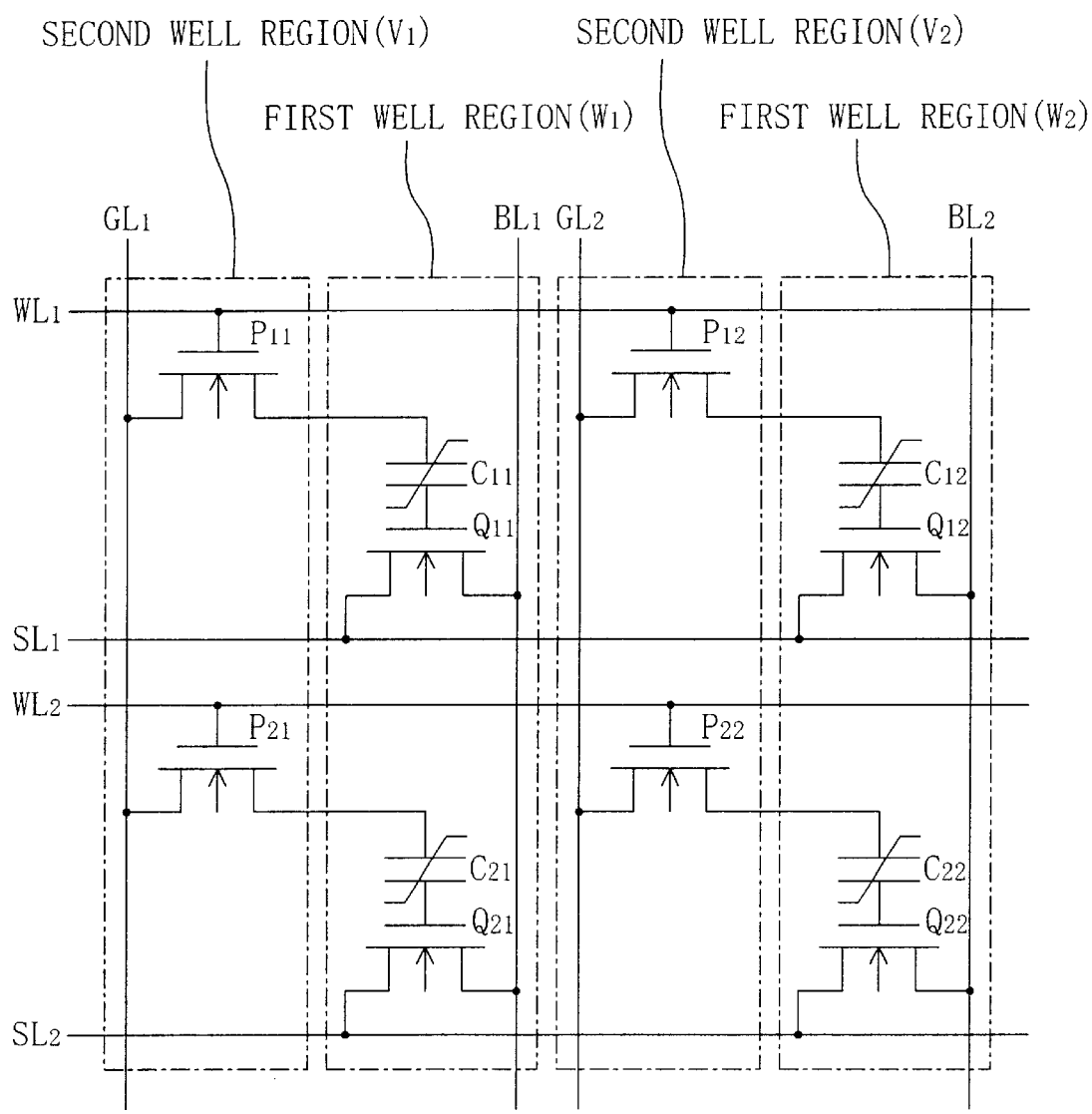
FIG. 1 is a plane view of a memory cell array in which memory cells each including a semiconductor memory according to Embodiment 1 are arranged in the form of a matrix.

FIG. 1 shows the plane structure of a memory cell array in which memory cells each including the semiconductor memory of Embodiment 1 are arranged in the form of a 2×2 matrix. In FIG. 1, $WL_1$ and $WL_2$ denote word lines, $SL_1$ and $SL_2$ denote source lines, $GL_1$ and $GL_2$ denote operation voltage supply lines, $BL_1$ and $BL_2$ denote bit lines, $Q_{11}$, $Q_{12}$, $Q_{21}$ and $Q_{22}$ denote field effect transistors for data storage (hereinafter simply referred to as storing transistors), $C_{11}$, $C_{12}$, $C_{21}$ and $C_{22}$ denote ferroelectric capacitors, and $P_{11}$, $P_{12}$, $P_{21}$ and $P_{22}$ denote field effect transistors for selecting the storing transistors $Q_{11}$, $Q_{12}$, $Q_{21}$ and $Q_{22}$ (hereinafter simply referred to as selecting transistors). The storing transistor $Q_{11}$, $Q_{12}$, $Q_{21}$ or $Q_{22}$ and the ferroelectric capacitor $C_{11}$, $C_{12}$, $C_{21}$ or $C_{22}$ disposed in the same memory cell together form an MFMIS transistor.

As shown in FIG. 1, p-type first well regions $W_1$ and $W_2$ and p-type second well regions $V_1$ and $V_2$ each extending along the column direction of the memory cell array are alternately provided along the row direction. The storing transistor Q is formed in the first well region W, and the selecting transistor P is formed in the second well region V.

The lower electrode of the ferroelectric capacitor C is connected to the gate electrode (floating gate) of the storing transistor Q, the upper electrode (control gate) of the ferroelectric capacitor C is connected to the operation voltage supply line GL through the selecting transistor P, and the gate of the selecting transistor P is connected to the word line WL. Accordingly, the selecting transistor P is turned on/off by the word line WL, so as to transfer a signal from the operation voltage supply line GL to the control gate of the storing transistor.

The drain of the storing transistor Q is connected to the bit line BL and the source of the storing transistor Q is connected to the source line SL, so as to read a data in accordance with a potential difference between the bit line BL and the source line SL.

Now, operations for writing a data in and reading a data from the memory cell disposed at an address 11 (namely, on the first row and in the first column) of the memory cell array composed of the semiconductor memory of this embodiment will be described with reference to FIG. 2.

(Write Operation)

First, as a preparation operation, a DC voltage $-V_p$ of, for example, −8 V is applied to the second well regions $V_1$ and $V_2$ where the selecting transistors P are formed ($V_1=V_2=-V_p$), and the first well regions $W_1$ and $W_2$ where the storing transistors Q are formed are grounded ($W_1=W_2=0$ V).

Thereafter, a data is written in the memory cell at the address 11 as follows:

A voltage $+V_p$ is applied to the word line $WL_1$ on the first row and a voltage $-V_p$ is applied to the word line $WL_2$ on the second row, thereby turning on the selecting transistors $P_{11}$ and $P_{12}$ on the first row. Thus, addresses on the first row are selected.

All the source lines $SL_1$ and $SL_2$ are grounded and all the bit lines $BL_1$ and $BL_2$ are grounded.

A voltage $+V_p$ or $-V_p$ corresponding to a binary data is applied to the operation voltage supply line $GL_1$ in the first column, and the operation voltage supply line $GL_2$ in the second column is grounded. Thus, the address in the first column is specified.

In this manner, the address 11 is specified, and the voltage $\pm V_p$ of, for example, $\pm 8$ V is applied between the control gate and the well of the MFMIS transistor disposed at the address 11, so that the binary data can be written in the MFMIS transistor disposed at the address 11. In this case, since the selecting transistors $P_{21}$ and $P_{22}$ on the second row are off, no data is written in the MFMIS transistors disposed on the second row. Also, since the operation voltage supply line $GL_2$ in the second column is grounded, the data stored in the MFMIS transistors disposed in the second column are not overwritten.

(Read Operation)

A data written in the memory cell at the address 11 is read as follows:

A voltage $V_p$ is applied to the word line $WL_1$ on the first row and a voltage $-V_p$ is applied to the word line $WL_2$ on the second row, so as to turn on the selecting transistors $P_{11}$ and $P_{12}$ on the first row. Thus, the addresses on the first row are selected.

A voltage of 0 V is applied to all the source lines $SL_1$ and $SL_2$, a voltage $V_d$ of, for example, 0.6 V is applied to the bit line $BL_1$ in the first column and a voltage of 0 V is applied to the bit line $BL_2$ in the second column. Thus, the address in the first column is specified.

A voltage $V_r$ of, for example, 0.7 V is applied to the operation voltage supply line $GL_1$ in the first column and a voltage of 0 V is applied to the operation voltage supply line $GL_2$ in the second column.

In this manner, the voltage $V_r$ is applied to the control gate of the MFMIS transistor disposed at the address 11 and the voltage $V_d$ is applied between the drain and the source of the MFMIS transistor. Therefore, a binary data written in the MFMIS transistor disposed at the address 11 is detected as a current change appearing between the drain and the source in accordance with the voltage $\pm V_p$. In this case, since the selecting transistors $P_{21}$ and $P_{22}$ on the second row are off, no current flows between the drain and the source of each MFMIS transistor disposed on the second row. Also, since no voltage is applied between the drain and the source of each MFMIS transistor disposed in the second column, no current flows therethrough.

Figure 3:
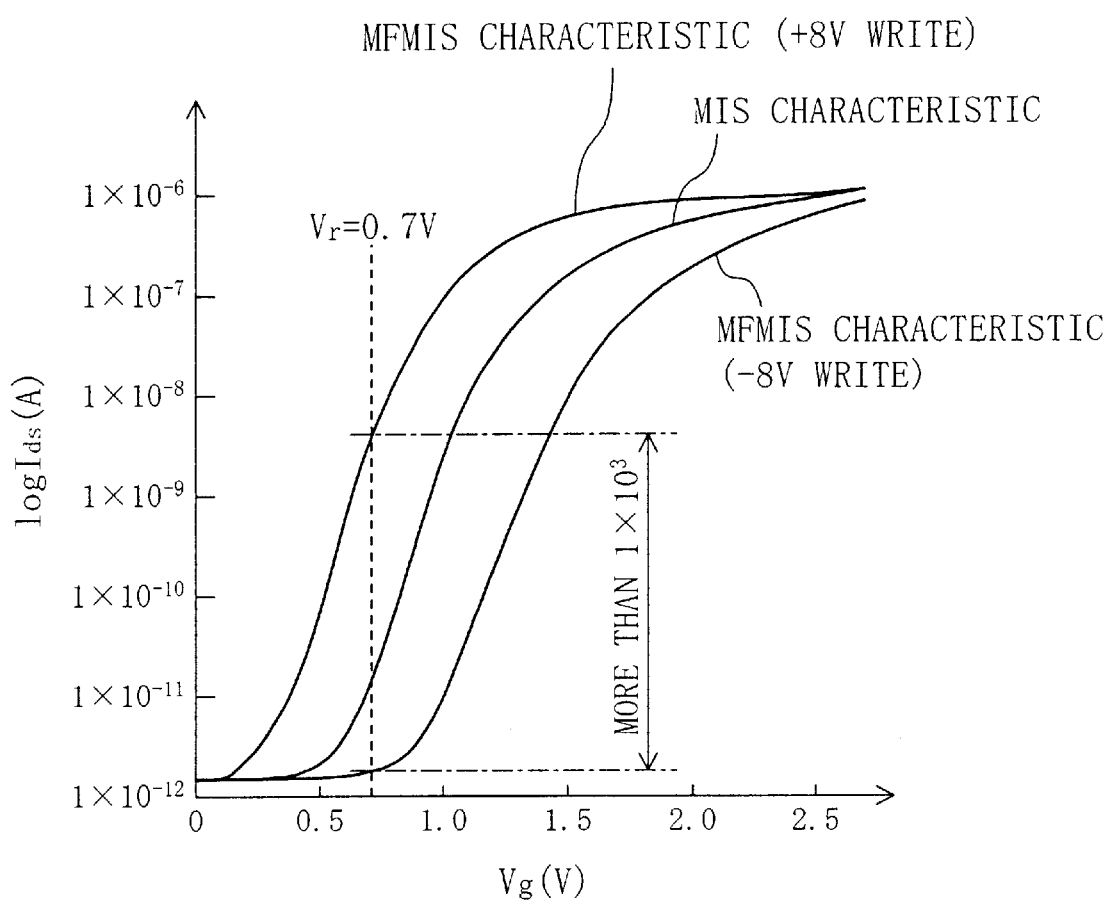
FIG. 3 is a diagram of $I_{ds}$–$V_G$ characteristics of an MIS transistor included in an MFMIS transistor and an MFMIS transistor in which polarization of a ferroelectric film is reversed by applying a voltage of +8 V or −8 V to its control gate.

FIG. 3 shows the $I_{ds}$–$V_G$ characteristics of an MIS transistor included in an MFMIS transistor and an MFMIS transistor in which polarization of a ferroelectric film is reversed by applying a voltage of +8 V or −8 V to its control gate. When a data is written by applying a voltage of, for example, +8 V to the control gate, the threshold value is shifted toward the minus side, and when a data is written by applying a voltage of, for example, −8 V to the control gate, the threshold value is shifted to the plus side. Accordingly, when the voltage $V_r$ of 0.7 V is applied to the control gate, an $I_{ds}$ ratio, namely, an on/off ratio, attained by applying voltages of +8 V and −8 V is larger than $1 \times 10^3$. Therefore, the binary data written in the MFMIS transistor can be read as a current change appearing between the drain and the source as an on/off ratio larger than $1 \times 10^3$.

Figure 4:
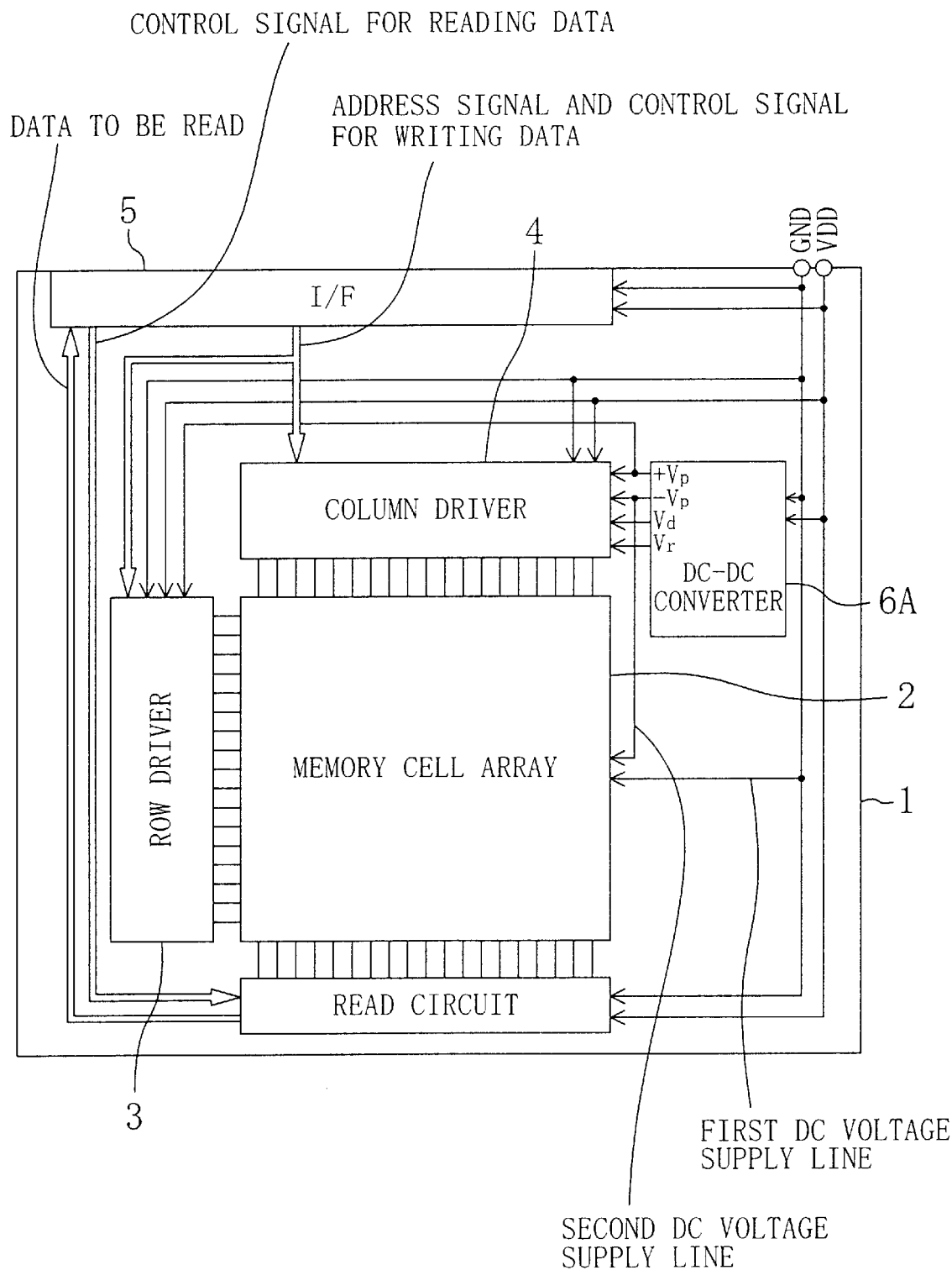
FIG. 4 is a plane view of a semiconductor chip mounting the memory cell array including the memory cells each composed of the semiconductor memory of Embodiment 1.

FIG. 4 shows the plane structure of a semiconductor chip 1 mounting the memory cell array composed of the semiconductor memory of Embodiment 1. On the semiconductor chip 1, the memory cell array 2, a row driver 3, a column driver 4, an I/F circuit 5 and a DC—DC converter 6A are formed.

A power voltage introduced from the outside to a VDD terminal on the semiconductor chip 1 and a ground voltage introduced from the outside to a GND terminal on the semiconductor chip 1 are respectively supplied to the row driver 3 and the column driver 4 corresponding to driving circuits for driving the memory cell array 2.

Also, the power voltage introduced to the VDD terminal is supplied to the DC—DC converter 6A, which generates a DC voltage $+V_p$, a DC voltage $-V_p$, a DC voltage $V_d$ and a DC voltage $V_r$. The DC voltage $+V_p$ generated by the DC—DC converter 6A is sent to the row driver 3 and the column driver 4, the DC voltage $-V_p$ generated by the DC—DC converter 6A is sent to the column driver 4, and the DC voltage $V_d$ and the DC voltage $V_r$ generated by the DC—DC converter 6A are sent to the column driver 4.

In the preparation for a write operation, the DC voltage $-V_p$ generated by the DC—DC converter 6A is supplied to the second well regions V of the memory cell array 2, and the ground voltage introduced to the GND terminal is directly supplied to the first well regions W of the memory cell array 2.

A voltage supply line for supplying the ground voltage introduced to the GND terminal to the first well regions W of the memory cell array 2 as the DC voltage of 0 V corresponds to a first voltage supply line, and a voltage supply line for supplying the DC voltage $-V_p$ generated by the DC—DC converter 6A to the second well regions V of the memory cell array 2 as the DC voltage $-V_p$ corresponds to a second voltage supply line.

Figure 5:
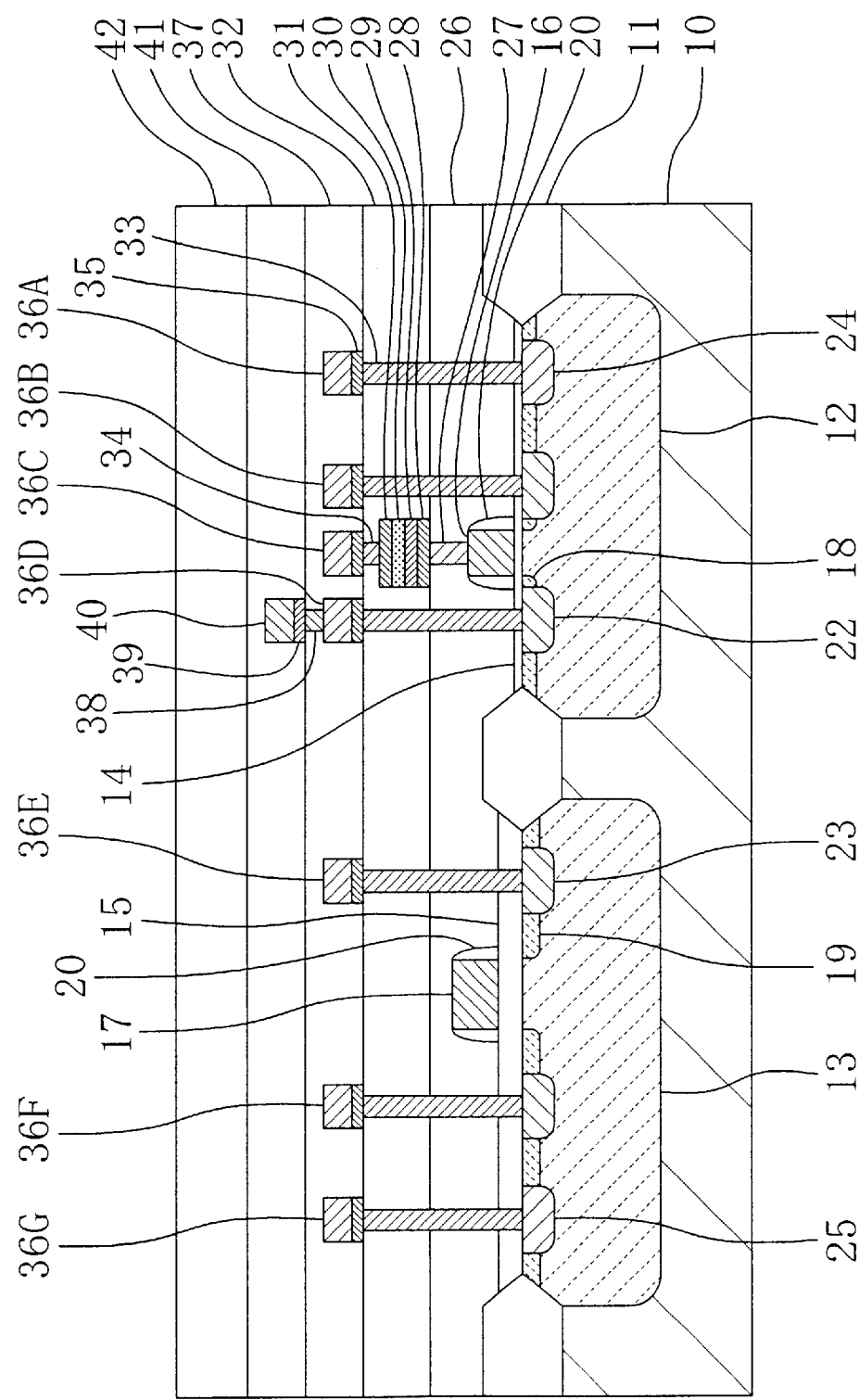
FIG. 5 is a cross-sectional view of the semiconductor memory of Embodiment 1.

FIG. 5 shows the cross-sectional structure of the semiconductor memory of Embodiment 1. An isolation region 11 is formed on a semiconductor substrate 10, and a p-type first well region 12 having a relatively small width and a p-type second well region 13 having a relatively large width are formed in surface portions of the semiconductor substrate 10 surrounded with the isolation region 11.

A first gate electrode 16 with a gate length of 0.6 $\mu$m is formed above the first well region 12 with a first gate insulating film 14 with a thickness of 26.5 nm sandwiched therebetween. A second gate electrode 17 with a gate length of 1.5 $\mu$m is formed above the second well region 13 with a second gate insulating film 15 with a thickness of 40 nm sandwiched therebetween. Sidewalls 20 are formed on the respective side faces of the first and second gate electrodes 16 and 17.

N-type first lightly-doped layers 18 with a length of 0.2 $\mu$m and n-type heavily-doped layers 22 are formed in surface portions of the first well region 12, and n-type second lightly doped layers 19 with a length of 1.5 $\mu$m and n-type heavily-doped layers 23 are formed in surface portions of the second well region 13. Also, a first contact layer 24 of a p-type heavily-doped layer is formed in another surface portion of the first well region 12, and a second contact layer 25 of a p-type heavily-doped layer is formed in another surface portion of the second well region 13.

The first lightly-doped layers 18, the first heavily-doped layers 22, the first gate insulating film 14 and the first gate electrode 16 together form the storing transistor Q, and the second lightly-doped layers 19, the second heavily-doped layers 23, the second gate insulating film 15 and the second gate electrode 17 together form the selecting transistor P. The operation voltage of the storing transistor Q can be set to 5 V and the operation voltage of the selecting transistor P can be set to 21 V.

This semiconductor memory has the following three characteristics: The second gate insulating film 15 has a larger thickness than the first gate insulating film 14; the second gate electrode 17 has a larger gate length than the first gate electrode 16; and the second lightly-doped layer 19 has a larger length than the first lightly-doped layer 18. Owing to at least one of these characteristics, the breakdown voltage of the selecting transistor P is larger than that of the storing transistor Q.

A first interlayer insulating film 26 is formed so as to cover the first and second gate electrodes 16 and 17. A barrier layer 28 of a TiN film, a lower electrode 29 of an Ir film, an $IrO_2$ film and a Pt film, a ferroelectric film 30 of a $SrBi_2Ta_2O_9$ film with a thickness of 200 nm and an upper electrode 31 of a Pt film are formed on the first interlayer insulating film 26. The lower electrode 29, the ferroelectric film 30 and the upper electrode 31 together form the ferroelectric capacitor C. The upper electrode 31 of the ferroelectric capacitor C is connected to the first gate electrode 16 of the storing transistor Q through a first contact plug 27.

A second interlayer insulating film 32 is formed so as to cover the ferroelectric capacitor C. Lower interconnects 36A, 36B, 36C, 36D, 36E, 36F and 36G of an Al film are formed above the second interlayer insulating film 32 with a barrier layer 35 of a TiN film sandwiched therebetween. The lower interconnect 36A is connected to the first contact layer 24 through a second contact plug 33, the lower interconnect 36B is connected to one of the first heavily-doped layers 22 through another second contact plug 33, the lower interconnect 36C is connected to the upper electrode 31 through a third contact plug 34, the lower interconnect 36D is connected to the other of the first heavily-doped layers 22 through another second contact plug 33, the lower interconnect 36E is connected to one of the second heavily-doped layers 23 through another second contact plug 33, the lower interconnect 36F is connected to the other of the second heavily-doped layers 23 through another second contact plug 33, and the lower interconnect 36G is connected to the second contact layer 25 through another second contact plug 33.

A third interlayer insulating film 37 is formed so as to cover the lower interconnects 36A, 36B, 36C, 36D, 36E, 36F and 36G. An upper interconnect 40 of an Al film is formed above the third interlayer insulating film 37 with a barrier layer 39 of a TiN film sandwiched therebetween. The lower interconnect 36D is connected to the upper interconnect 40 through a fourth contact plug 38.

A first protection film 41 of a $SiO_2$ film is formed so as to cover the upper interconnect 40, and a second protection film 42 of a $SiN_x$ film is formed on the first protection film 41.

Now, a method for fabricating the semiconductor memory of Embodiment 1 will be described with reference to FIGS. 6A, 6B, 7A, 7B, 8A, 8B, 9 and 10.

Figure 6A:
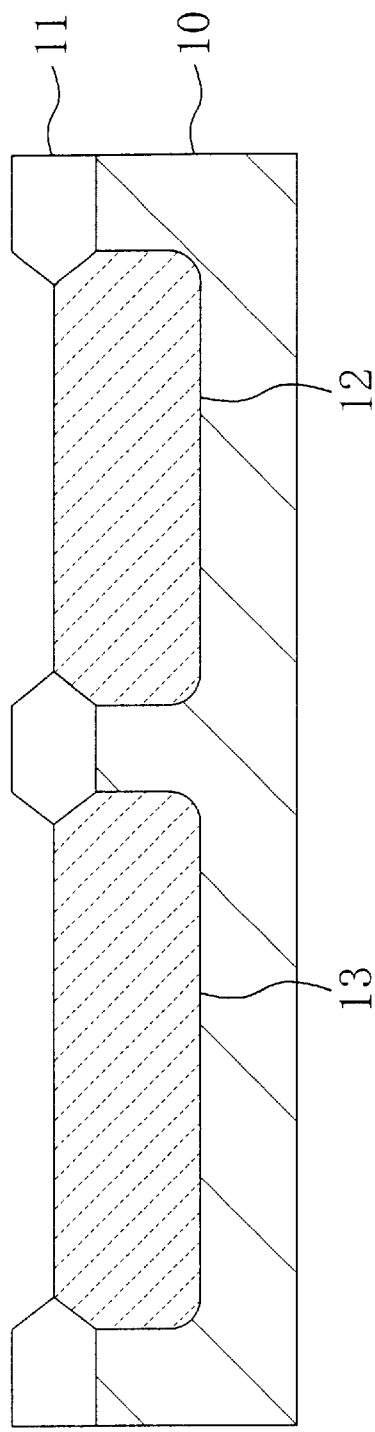
FIGS. 6A and 6B are cross-sectional views for showing procedures in fabrication of the semiconductor memory of Embodiment 1.

First, as shown in FIG. 6A, an isolation region 11 of $SiO_2$ is formed on a semiconductor substrate 10 of Si by the LOCOS method. A p-type dopant is ion implanted into surface portions of the semiconductor substrate 10 surrounded with the isolation region 11, thereby forming a p-type first well region 12 having a relatively small width and a p-type second well region 13 having a relatively large width.

Figure 6B:
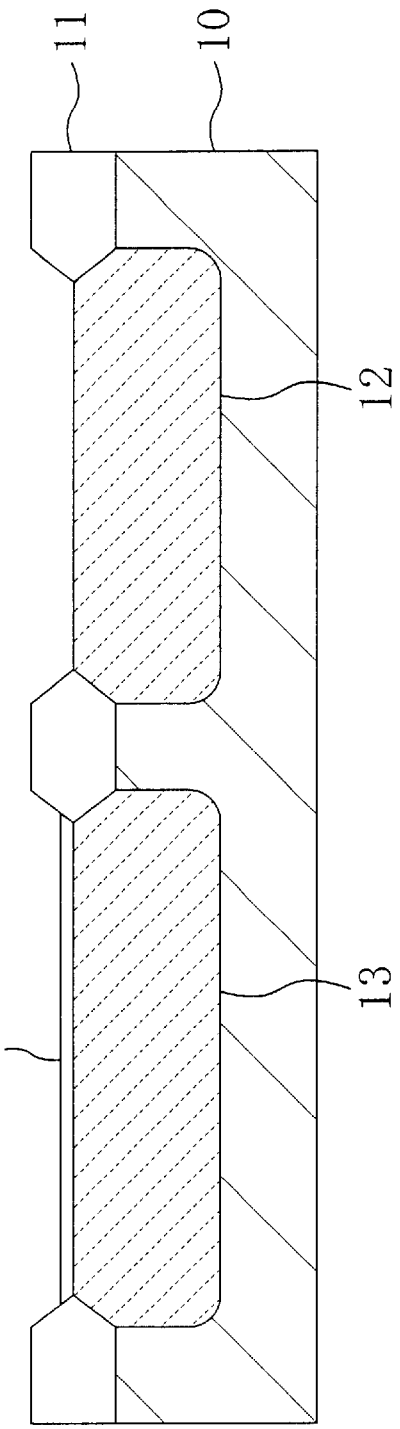

Next, the semiconductor substrate 10 is subjected to thermal oxidation, so as to form a $SiO_2$ film with a thickness of 26.5 nm on the first and second well regions 12 and 13. A portion of the $SiO_2$ film formed on the first well region 12 is selectively removed by etching. Thus, a second gate insulating film 15 is formed from the $SiO_2$ film with a thickness of 26.5 nm on the second well region 13 as shown in FIG. 6B.

Figure 7A:
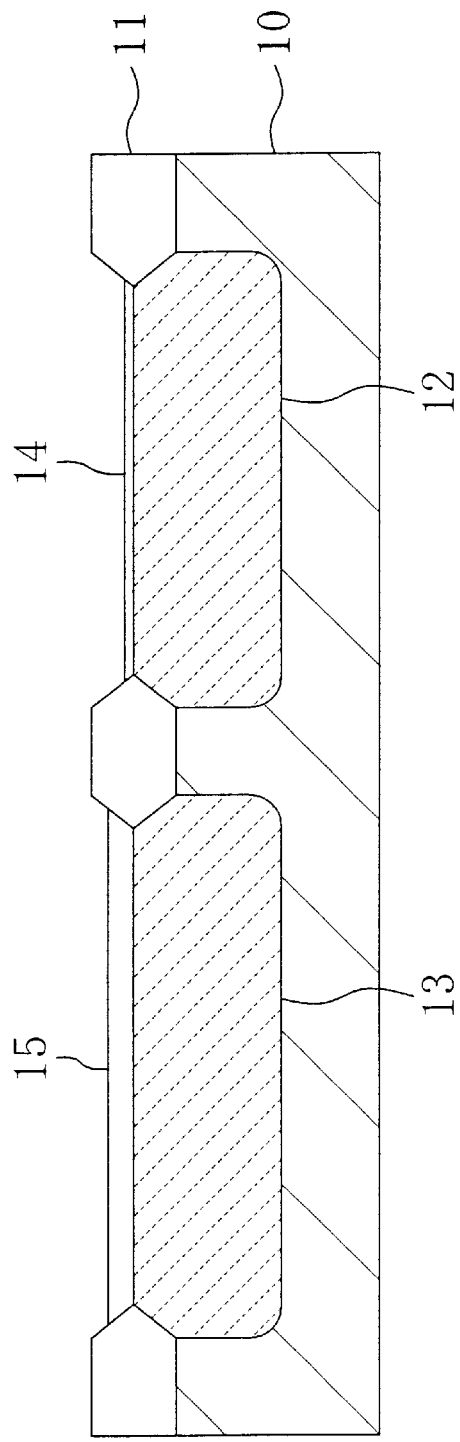
FIGS. 7A and 7B are cross-sectional views for showing other procedures in the fabrication of the semiconductor memory of Embodiment 1.

Then, the semiconductor substrate 10 is subjected to the thermal oxidation again, so as to form a first gate insulating film 14 of a $SiO_2$ film with a thickness of 13.5 nm on the first well region 12 and increase the thickness of the second gate insulating film 15 formed on the second well region 12 to 40 nm as shown in FIG. 7A.

Figure 7B:
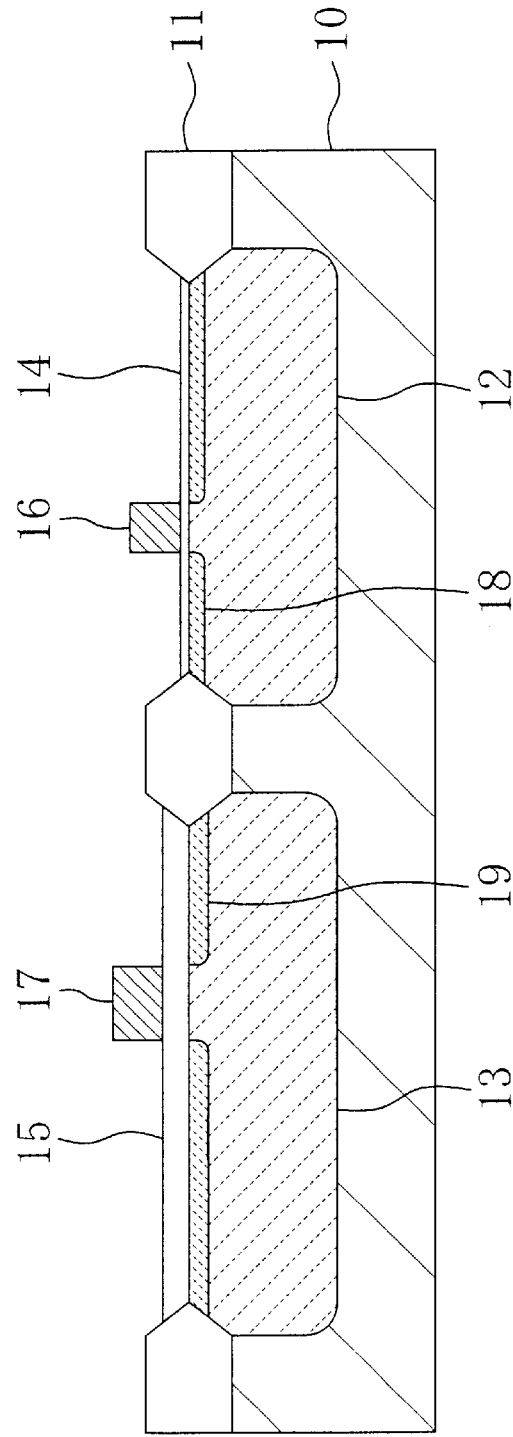

Next, after depositing a polysilicon film with a thickness of 300 nm on the first and second gate insulating films 14 and 15, the polysilicon film is doped with phosphorus ions, and the polysilicon film doped with phosphorus is patterned. Thus, a first gate electrode 16 with a gate length of 0.6 $\mu$m is formed on the first insulating film 14 and a second gate electrode 17 with a gate length of 1.5 $\mu$m is formed on the second insulating film 15 as shown in FIG. 7B. Thereafter, n-type dopant ions are implanted into surface portions of the first well region 12 with the first gate electrode 16 used as a mask, thereby forming n-type first lightly-doped layers 18, and n-type dopant ions are implanted into surface portions of the second well region 13 with the second gate electrode 17 used as a mask, thereby forming n-type second lightly-doped layers 19.

Figure 8A:
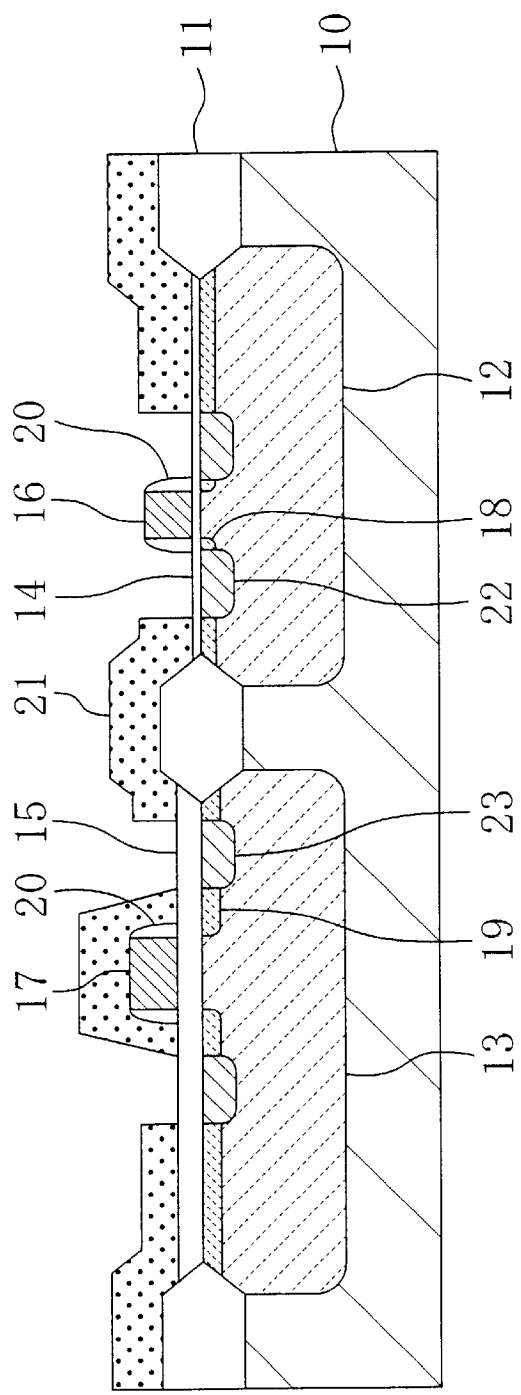
FIGS. 8A and 8B are cross-sectional views for showing other procedures in the fabrication of the semiconductor memory of Embodiment 1.

Next, after depositing a $SiO_2$ film over the semiconductor substrate 10, the $SiO_2$ film is anisotropically etched, so as to form sidewalls 20 on the side faces of the first and second gate electrodes 16 and 17 as shown in FIG. 8A. Then, after a resist pattern 21 having openings in regions for forming heavily-doped layers is formed on the semiconductor substrate 10, n-type dopant ions are doped by using the resist pattern 21 as a mask. Thus, first heavily-doped layers 22 are formed in the first well region 12 and second heavily-doped layers 23 are formed in the second well region 13. In this case, since the resist pattern 21 covers the second gate electrode 17 but does not cover the first gate electrode 16, the length (1.5 $\mu$m) of a portion of the second lightly-doped layer 19 closer to the second gate electrode is larger than the length (0.2 $\mu$m) of a portion of the first lightly-doped layer 18 closer to the first gate electrode.

In this manner, a storing transistor Q including the first lightly-doped layers 18, the first heavily-doped layers 22, the first gate insulating film 14 and the first gate electrode 16 is formed, and a selecting transistor P including the second lightly-doped layers 19, the second heavily-doped layers 23, the second gate insulating film 15 and the second gate electrode 17 is formed.

Figure 8B:
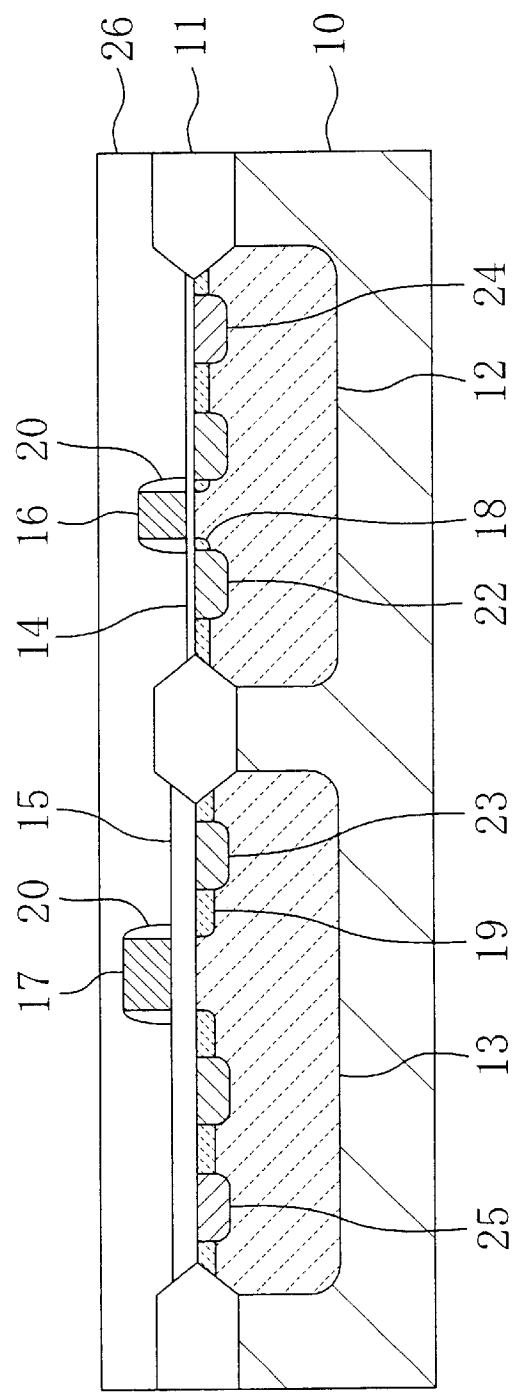

Next, although not shown in the drawings, a resist pattern having openings in regions for forming contact layers is formed on the semiconductor substrate 10, and p-type dopant ions are doped by using the resist pattern as a mask. Thus, as shown in FIG. 8B, a first contact layer 24 is formed in the first well region 12 and a second contact layer 25 is formed in the second well region 13. Subsequently, annealing is carried out at a temperature of 900° C., and a first interlayer insulating film 26 of a $SiO_2$ film is formed over the semiconductor substrate 10.

Figure 9:
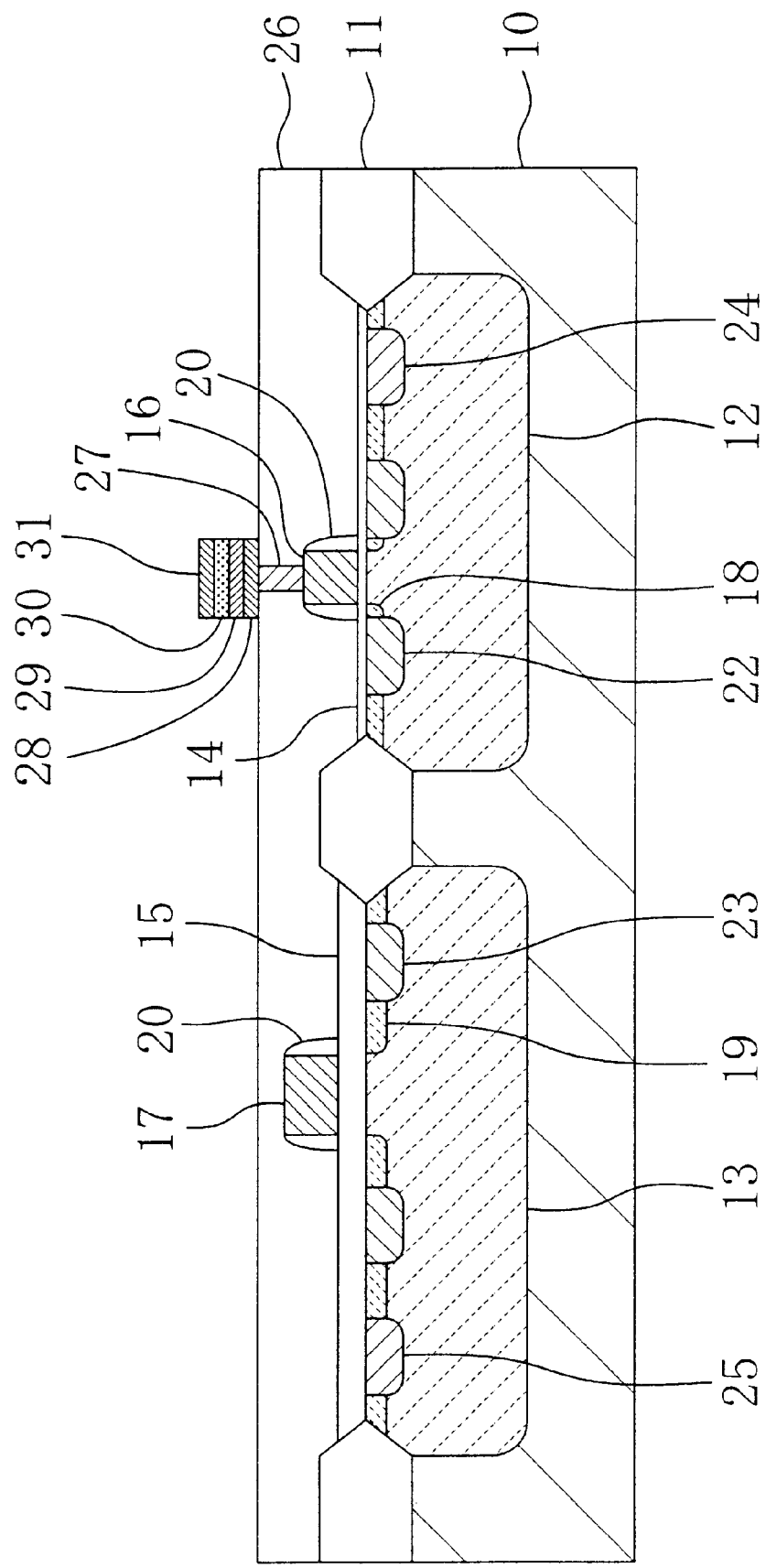
FIG. 9 is a cross-sectional view for showing another procedure in the fabrication of the semiconductor memory of Embodiment 1.

Then, as shown in FIG. 9, a plug hole is formed in the first interlayer insulating film 26, and a polysilicon film is deposited on the first interlayer insulating film 26. Thereafter, a portion of the polysilicon film deposited outside of the plug hole is removed, so as to form, in the first interlayer insulating film 26, a first contact plug 27 for connection to the second gate electrode 17.

Next, a multi-layer film is formed by successively depositing a TiN film, an Ir film, an $IrO_2$ film and a Pt film on the first interlayer insulating film 26 by sputtering, and the multi-layer film is patterned, thereby forming a barrier layer 28 of the TiN film and a lower electrode 29 of the Ir film, the $IrO_2$ film and the Pt film. Then, a first $SrBi_2Ta_2O_9$ film (hereinafter referred to as an SBT film) with a thickness of 100 nm is formed on the lower electrode 29 by spin coating, and the first SBT film is crystallized by carrying out annealing at 800° C. Thereafter, a second SBT film with a thickness of 100 nm is formed on the first SBT film by the spin coating, and the second SBT film is crystallized by carrying out annealing at 800° C. Next, a Pt film is deposited on the second SBT film by the sputtering, and the Pt film, the second SBT film and the first SBT film are patterned, thereby forming a ferroelectric film 30 of the first and second SBT films and an upper electrode 31 of the Pt film.

In this manner, a ferroelectric capacitor C including the lower electrode 29, the ferroelectric film 30 and the upper electrode 31 is formed, and the first gate electrode 16 of the storing transistor Q is connected to the upper electrode 31 of the ferroelectric capacitor C through the first contact plug 27.

Figure 10:
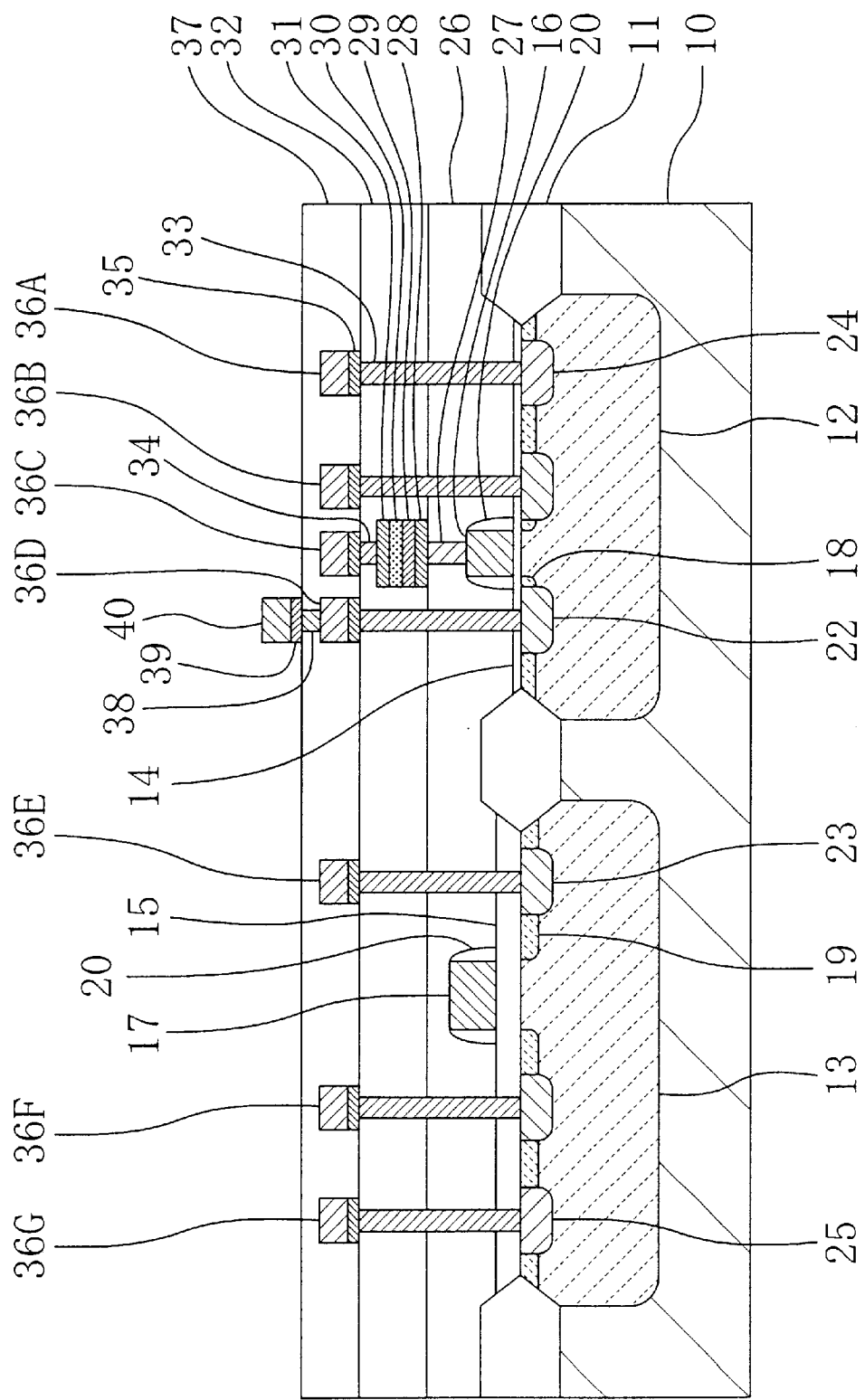
FIG. 10 is a cross-sectional view for showing another procedure in the fabrication of the semiconductor memory of Embodiment 1.

Next, as shown in FIG. 10, a second interlayer insulating film 32 of a $SiO_2$ film is deposited so as to cover the ferroelectric capacitor C, and the second interlayer insulating film 32 is planarized by CMP. Then, via holes are formed in the second interlayer insulating film 32 and a W film is deposited over the second interlayer insulating film 32. A portion of the W film exposed on the second interlayer insulating film 32 is removed, so as to form, in the first interlayer insulating film 26 and the second interlayer insulating film 32, second contact plugs 33 from the W film and to form a third contact plug 34 in the second interlayer insulating film 32.

Then, a TiN film and an Al film are successively deposited on the second interlayer insulating film 32, and the TiN film and the Al film are patterned, thereby forming a barrier layer 35 of the TiN film and lower interconnects 36A, 36B, 36C, 36D, 36E, 36F and 36G of the Al film. In this case, the lower interconnect 36A is connected to the first contact layer 24 through the second contact plug 33, the lower interconnect 36B is connected to one of the first heavily-doped layers 22 through the second contact plug 33, the lower interconnect 36C is connected to the upper electrode 31 through the third contact plug 34, the lower interconnect 36D is connected to the other of the first heavily-doped layers 22 through the second contact plug 33, the lower interconnect 36E is connected to one of the second heavily-doped layers 23 through the second contact plug 33, the lower interconnect 36F is connected to the other of the second heavily-doped layers 23 through the second contact plug 33, and the lower interconnect 36G is connected to the second contact layer 25 through the second contact plug 33.

Next, a third interlayer insulating film 37 of a $SiO_2$ film is deposited so as to cover the lower interconnects 36A, 36B, 36C, 36D, 36E, 36F and 36G, and the third interlayer insulating film 37 is planarized by the CMP. Thereafter, a fourth contact plug 38 is formed in the third interlayer insulating film 37 similarly to the second and third contact plugs 33 and 34.

Subsequently, a TiN film and an Al film are successively deposited on the third interlayer insulating film 32, and the TiN film and the Al film are patterned, thereby forming a barrier layer 39 of the TiN film and an upper interconnect 40 of the Al film. In this case, the lower interconnect 36D is connected to the upper interconnect 40 through the fourth contact plug 38.

Next, a first protection film 41 of $SiO_2$ film is deposited so as to cover the upper interconnect 40 and a second protection film 42 of a $SiN_x$ film is deposited on the first protection film 41. Thus, the semiconductor memory of Embodiment 1 shown in FIG. 5 is completed.

Embodiment 2

A semiconductor memory and a method for driving the same according to Embodiment 2 of the invention will now be described with reference to FIGS. 11 through 13. Although the semiconductor memory of Embodiment 2 uses an MFMIS transistor as a storing transistor for storing a data, an MFS transistor or an MFIS transistor may be used instead.

Figure 11:
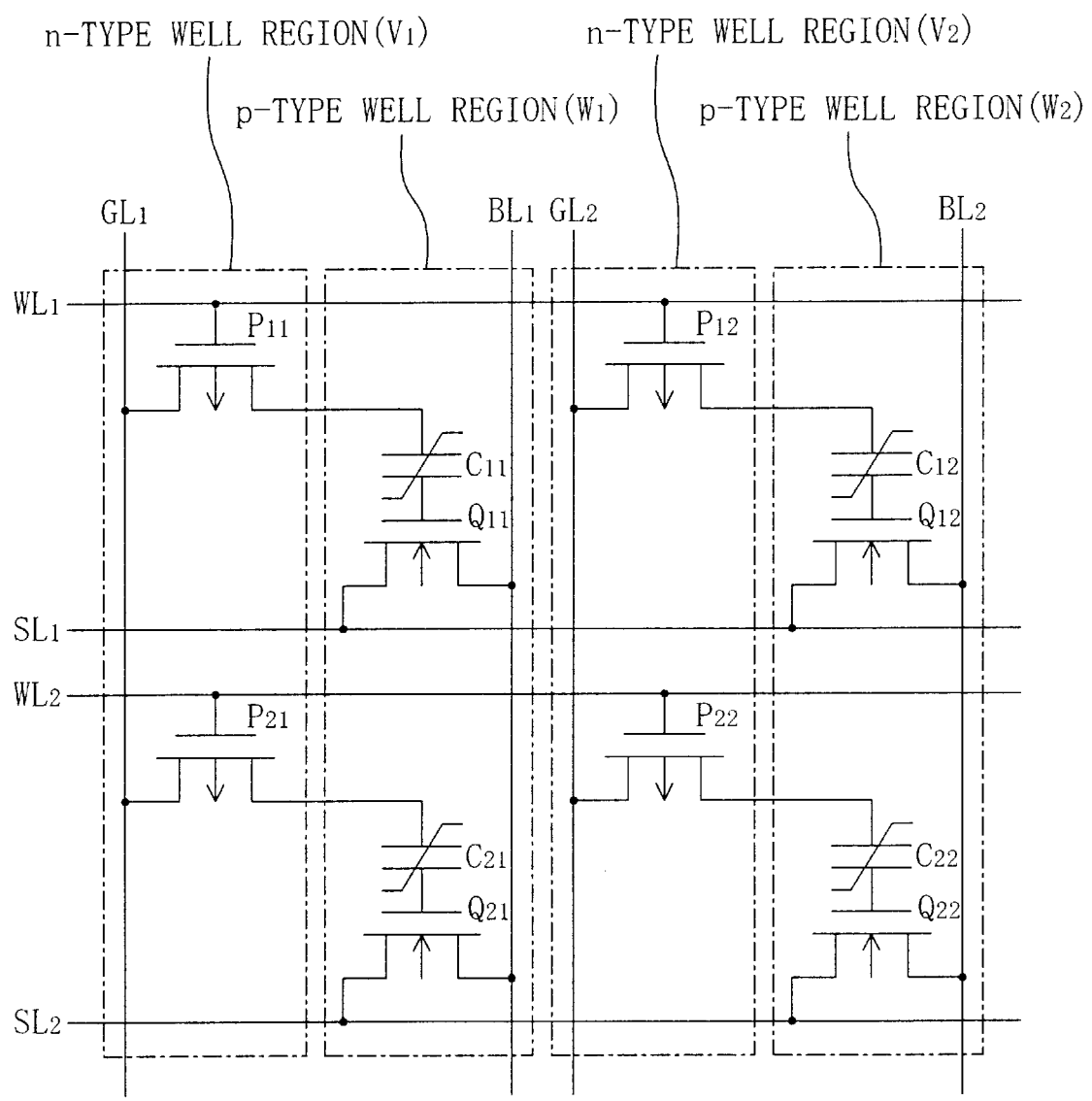
FIG. 11 is a plane view of a memory cell array in which memory cells each including a semiconductor memory according to Embodiment 2 are arranged in the form of a matrix.

FIG. 11 shows the plane structure of a memory cell array in which memory cells each including the semiconductor memory of Embodiment 2 are arranged in the form of a 2×2 matrix. In FIG. 11, $WL_1$ and $WL_2$ denote word lines, $SL_1$ and $SL_2$ denote source lines, $GL_1$ and $GL_2$ denote operation voltage supply lines, $BL_1$ and $BL_2$ denote bit lines, $Q_{11}$, $Q_{12}$, $Q_{21}$ and $Q_{22}$ denote storing transistors, $C_{11}$, $C_{12}$, $C_{21}$ and $C_{22}$ denote ferroelectric capacitors, and $P_{11}$, $P_{12}$, $P_{21}$ and $P_{22}$ denote selecting transistors. The storing transistor $Q_{11}$, $Q_{12}$, $Q_{21}$ or $Q_{22}$ and the ferroelectric capacitor $C_{11}$, $C_{12}$, $C_{21}$ or $C_{22}$ disposed in the same memory cell together form an MFMIS transistor.

N-type first well regions $W_1$ and $W_2$ and p-type second well regions $V_1$ and $V_2$ each extending along the column direction of the memory cell array are alternately provided along the row direction. The storing transistor Q is formed in the first well region W, and the selecting transistor P is formed in the second well region V.

In the same manner as in Embodiment 1, the lower electrode of the ferroelectric capacitor C is connected to the gate electrode (floating gate) of the storing transistor Q. the upper electrode (control gate) of the ferroelectric capacitor C is connected to the operation voltage supply line GL through the selecting transistor P, and the gate of the selecting transistor P is connected to the word line WL.

The drain of the storing transistor Q is connected to the bit line BL and the source of the storing transistor Q is connected to the source line SL, so as to read a data in accordance with a potential difference between the bit line BL and the source line SL.

Now, operations for writing a data in and reading a data from the memory cell disposed at an address 11 (namely, on the first row and in the first column) of the memory cell array composed of the semiconductor memory of this embodiment will be described with reference to FIG. 12.

(Write Operation)

First, as a preparation operation, a DC voltage $V_p$ of, for example, +8 V is applied to the second well regions V where the selecting transistors P are formed ($V_1=V_2=V_p$) and the first well regions W where the storing transistors Q are formed are grounded ($W_1=W_2=0$ V).

Thereafter, a data is written in the memory cell at the address 11 as follows:

A voltage $-V_p$ is applied to the word line $WL_1$ on the first row and the word line $WL_2$ on the second row is grounded, thereby turning on the selecting transistors $P_{11}$ and $P_{12}$ disposed on the first row. Thus, addresses on the first row are selected.

All the source lines $SL_1$ and $SL_2$ are grounded and all the bit lines $BL_1$ and $BL_2$ are grounded.

A voltage $+V_p$ or $-V_p$ corresponding to a binary data is applied to the operation voltage supply line $GL_1$ in the first column, and the operation voltage supply line $GL_2$ in the second column is grounded. Thus, the address in the first column is specified.

In this manner, the address 11 is specified, and a voltage $\pm V_p$ of, for example, $\pm 8$ V is applied between the control gate and the well of the MFMIS transistor disposed at the address 11, so that the binary data can be written in the MFMIS transistor at the address 11. In this case, since the selecting transistors $P_{21}$ and $P_{22}$ disposed on the second row are off, no data is written in the MFMIS transistors on the second row. Also, since the operation voltage supply line $GL_2$ in the second column is grounded, the data stored in the MFMIS transistors in the second column are not overwritten.

(Read Operation)

A data written in the memory cell at the address 11 is read as follows:

A voltage $-V_p$ is applied to the word line $WL_1$ on the first row and a voltage of 0 V is applied to the word line $WL_2$ on the second row, so as to turn on the selecting transistors $P_{11}$ and $P_{12}$ on the first row. Thus, the addresses on the first row are selected.

A voltage of 0 V is applied to all the source lines $SL_1$ and $SL_2$, a voltage $V_d$ of, for example, 0.6 V is applied to the bit line $BL_1$ in the first column and a voltage of 0 V is applied to the bit line $BL_2$ in the second column. Thus, the address in the first column is specified.

A voltage $V_r$ of, for example, 0.7 V is applied to the operation voltage supply line $GL_1$ in the first column and a voltage of 0 V is applied to the operation voltage supply line $GL_2$ in the second column.

In this manner, the voltage $V_r$ is applied to the control gate of the MFMIS transistor disposed at the address 11 and the voltage $V_d$ is applied between the drain and the source of the MFMIS transistor. Therefore, a binary data written in the MFMIS transistor disposed at the address 11 is detected as a current change appearing between the drain and the source in accordance with the voltage $\pm V_p$. In this case, since the selecting transistors $P_{21}$ and $P_{22}$ disposed on the second row are off, no current flows between the drain and the source of each MFMIS transistor disposed on the second row. Also, since no voltage is applied between the drain and the source of each MFMIS transistor disposed in the second column, no current flows therethrough.

Figure 13:
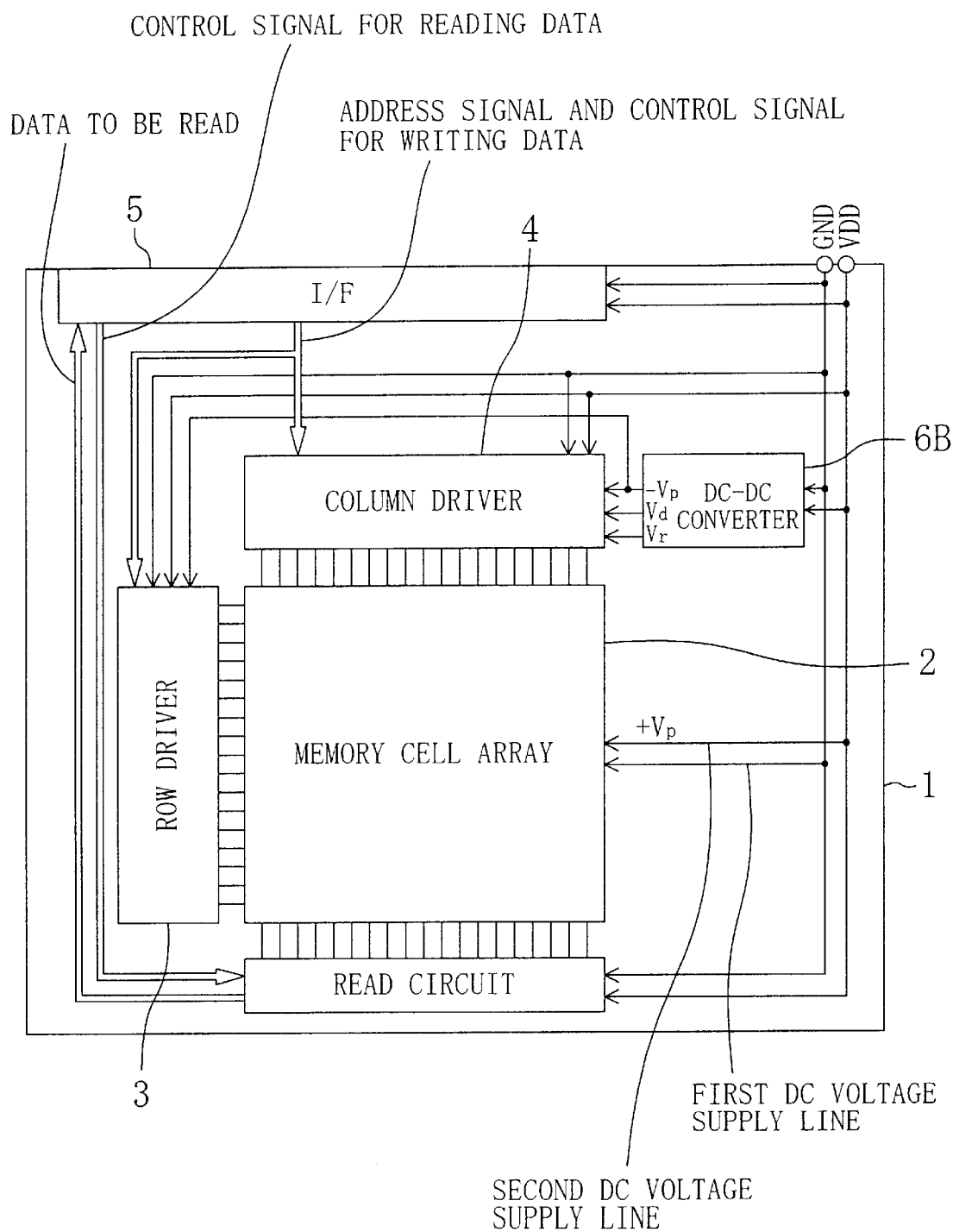
FIG. 13 is a plane view of a semiconductor chip mounting the memory cell array including the memory cells each composed of the semiconductor memory of Embodiment 2.
Figures 14, 15:
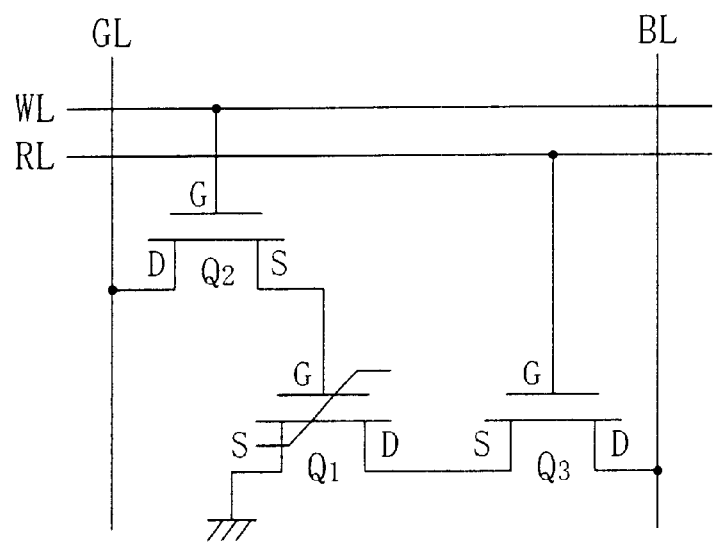
FIG. 14 is a circuit diagram of a conventional nonvolatile semiconductor memory.
FIG. 15 is a diagram of voltages applied in a write operation and a read operation of the conventional nonvolatile semiconductor memory.

FIG. 13 shows the plane structure of a semiconductor chip 1 mounting the memory cell array composed of the semiconductor memory of Embodiment 2. On the semiconductor chip 1, the memory cell array 2, a row driver 3, a column driver 4, an I/F circuit 5 and a DC—DC converter 6B are formed.

A power voltage introduced from the outside to a VDD terminal on the semiconductor chip 1 and a ground voltage introduced from the outside to a GND terminal on the semiconductor chip 1 are respectively supplied to the row driver 3 and the column driver 4 corresponding to driving circuits for driving the memory cell array 2.

Also, the power voltage introduced to the VDD terminal is supplied to the DC—DC converter 6B, which generates a DC voltage $-V_p$, a DC voltage $V_d$ and a DC voltage $V_r$. The DC voltage $-V_p$ generated by the DC—DC converter 6B is sent to the row driver 3 and the column driver 4, and the DC voltage $V_d$ and the DC voltage $V_r$ generated by the DC—DC converter 6B are sent to the column driver 4.

In the preparation for a write operation, the power voltage $V_p$ introduced to the VDD terminal is directly supplied to the second well regions V of the memory cell array 2, and the ground voltage introduced to the GND terminal is directly supplied to the first well regions W of the memory cell array 2.

A voltage supply line for supplying the ground voltage introduced to the GND terminal to the first well regions W of the memory cell array 2 corresponds to a first voltage supply line, and a voltage supply line for supplying the power voltage introduced to the VDD terminal to the second well regions V of the memory cell array 2 corresponds to a second voltage supply line.

In Embodiment 2, since the power voltage introduced to the VDD terminal is directly supplied to the second well regions V of the memory cell array 2 as the DC voltage $V_p$, the DC—DC converter 6B need not generate a DC voltage $+V_p$. Therefore, the area of the DC—DC converter 6B of Embodiment 2 can be smaller than that of the DC—DC converter 6A of Embodiment 1.

What is claimed is:

1. A semiconductor memory comprising:
   a storing transistor for storing a data, said storing transistor including a field effect transistor and being selected from a group consisting of (1) an MFS transistor having a gate electrode formed on a ferroelectric film, (2) an MFIS transistor having a gate electrode formed on a multi-layer film of a ferroelectric film and a dielectric film, and (3) an MFMIS transistor including a ferroelectric capacitor formed above a gate electrode of a MIS transistor, and having a well region;
   a selecting transistor for selecting said storing transistor, said selecting transistor being a field effect transistor having a well region that is isolated from said well region of said storing transistor;
   a first voltage supply line for supplying a DC voltage to said well region of said storing transistor; and
   a second voltage supply line independent of said first voltage supply line for supplying a DC voltage to said well region of said selecting transistor.

2. The semiconductor memory of claim 1,
   wherein said selecting transistor has a higher breakdown voltage than said storing transistor.

3. The semiconductor memory of claim 2,
   wherein said storing transistor is a MFMIS transistor, and
   said selecting transistor includes a gate insulating film having a larger thickness than a gate insulating film of said storing transistor.

4. The semiconductor memory of claim 2,
   wherein said storing transistor is a MFMIS transistor,
   said storing transistor and said selecting transistor have an LDD structure, and
   said selecting transistor includes a lightly-doped layer having a larger length than a lightly-dope layer of said storing transistor.

5. The semiconductor memory of claim 2,
   wherein said storing transistor is a MFMIS transistor, and
   said selecting transistor includes a gate electrode having a larger gate length than a gate electrode of said storing transistor.

6. The semiconductor memory of claim 1,
   wherein said storing transistor, said selecting transistor and a driving circuit for driving said storing and selecting transistors are formed on one semiconductor substrate, and
   a driving voltage supplied to said driving circuit and the DC voltage supplied to said well region of said selecting transistor are supplied from one voltage supply.

7. The semiconductor memory of claim 1,
wherein said well region of said storing transistor and said well region of said selecting transistor have different conductivity types.

8. A method for driving a semiconductor memory including a storing transistor for storing a data, said storing transistor including a field effect transistor and being selected from a group consisting of (1) an MFS transistor having a gate electrode formed on a ferroelectric film, (2) an MFIS transistor having a gate electrode formed on a multi-layer film of a ferroelectric film and a dielectric film, and (3) an MFMIS transistor including a ferroelectric capacitor formed above a gate electrode of a MIS transistor, and a selecting transistor for selecting said storing transistor, said storing transistor having a well region that is isolated from a well region of said selecting transistor, said method comprising:

a step of writing a data in said storing transistor by applying a first DC voltage to said well region of said first storing transistor and applying a second DC voltage with polarity positive or negative with respect to said first DC voltage to a control gate of said storing transistor.

9. The method for driving a semiconductor memory of claim 8,
wherein said selecting transistor has a higher breakdown voltage than said storing transistor.

10. The method of driving a semiconductor memory of claim 8,
wherein a driving voltage supplied to a driving circuit for driving said storing and selecting transistors and a DC voltage supplied to said well region of said selecting transistor are supplied from one voltage supply.

11. The method for driving a semiconductor memory of claim 8,
wherein said well region of said storing transistor and said well region of said selecting transistor have different conductivity types.

* * * * *